United States Patent [19]

Shimoji

[11] Patent Number: 5,349,221
[45] Date of Patent: Sep. 20, 1994

[54] SEMICONDUCTOR MEMORY DEVICE AND METHOD OF READING OUT INFORMATION FOR THE SAME

[75] Inventor: Noriyuki Shimoji, Kyoto, Japan
[73] Assignee: Rohm Co., Ltd., Kyoto, Japan
[21] Appl. No.: 963,632
[22] Filed: Oct. 20, 1992

[30] Foreign Application Priority Data

Oct. 25, 1991 [JP] Japan .................. 3-279829

[51] Int. Cl.[5] .............. H01L 29/68; G11C 11/40
[52] U.S. Cl. .................... 257/324; 365/184
[58] Field of Search .................. 257/324; 365/184

[56] References Cited

U.S. PATENT DOCUMENTS 4,173,791 11/1979 Bell ........................ 257/324
5,079,603 1/1992 Komori et al. ................ 257/316

Primary Examiner—Rolf Hille
Assistant Examiner—Robert Limanek
Attorney, Agent, or Firm—Steven M. Rabin

[57] ABSTRACT

In a memory cell according to the present invention, when positive high voltages are respectively applied to a gate(20) and a drain region(14) and a source region(13) is grounded, hot electrons are produced in the boundary between the drain region(14) and a channel(25). The hot electrons are locally injected into an insulation film(19), to be trapped therein. Consequently, information is written. At the time of reading out information, the drain region(14) is grounded, a positive read voltage is applied to the source region(13), and a predetermined sense voltage is applied to the gate(20). At this time, the area between the source and the drain is kept in a non-conduction state if electrons are stored in the insulation film(19), while conduction occurs between the source and the drain if no electrons are stored therein. Since the formation of the channel(25) in the vicinity of the drain region(14) is delayed at the time of reading, thereby to make it possible to increase a threshold voltage, therefore, information can be accurately read out. No hot electrons are produced in the boundary between the drain region(14) and the channel(25) at the time of reading, it is possible to effectively prevent so-called soft writing.

21 Claims, 9 Drawing Sheets

SEMICONDUCTOR MEMORY DEVICE AND METHOD OF READING OUT INFORMATION FOR THE SAME

BACKGROUND OF THE INVENTION

1. Field of the Invention

The present invention relates to a semiconductor memory device suitably implemented by an EPROM (Erasable Programmable Read-Only Memory), an EEPROM (Electrically Erasable and Programmable Read-Only Memory) or the like and using as a memory cell a transistor capable of trapping electrons or holes in an insulation film formed above a channel region and a method of reading out information for the semiconductor memory device.

2. Description of the Prior Art

The typical prior art is disclosed in a document entitled "A True Single-Transistor Oxide-Nitride-Oxide EEPROM Device" IEEE ELECTRON DEVICE LETTERS, VOL. EDL-8, NO.3, MARCH 1987, PP93–95, and the construction of a semiconductor memory device in the prior art is illustrated in FIGS. 9(a) and 9(b). More specifically, in a transistor constituting a memory cell used in the semiconductor memory device, an n+-type impurity region having a high concentration is provided on a p-type semiconductor substrate 1 to form a source region 2 and a drain region 3, an insulation film 4 capable of trapping electrons or holes is formed on the surface of the semiconductor substrate 1 between the source region 2 and the drain region 3, and a gate 5 is formed on the insulation film 4. The insulation film 4 is constituted by a so-called ONO film having a structure in which a nitride film 4C is sandwiched between a tunnel oxide film 4A and a top oxide film 4B.

As shown in FIG. 9(a), when positive high voltages (for example, 10 volts and 9 volts) are respectively applied to the gate 5 and the drain region 3 and the source region 2 is grounded to cause a current to flow between the source and the drain, hot electrons are generated in an end 3A of the drain region 3. The hot electrons are locally injected into the insulation film 4 in the vicinity of the drain region 3, to be trapped in the nitride film 4C.

The profile of the impurity concentration of a diffusion layer constituting the drain region 3 is rapidly changed in the boundary between the drain region 3 and a channel region 8. Consequently, a strong electric field is formed in the boundary between the channel region 8 and the drain region 3, so that hot electrons are easily produced.

When information is read out, the source region 2 is grounded and a predetermined positive voltage (for example, 1 volt) is applied to the drain region 3, as shown in FIG. 9(b). In this state, a predetermined sense voltage (for example, 3 volts) is applied to the gate 5. A threshold voltage Vth for allowing conduction between the source and the drain differs depending on the state of the insulation film 4. That is, the threshold voltage Vth takes a high value V1 in a state where electrons are injected into the insulation film 4, while taking a low value V2 (V2<V1) in a state where no electrons are injected. If the above-mentioned sense voltage is set to a voltage between the high threshold voltage and the low threshold voltage, therefore, information stored in this cell can be read out by applying such a sense voltage to the gate 5 and watching whether or not conduction occurs between the source and the drain.

Stored information can be erased by irradiation of ultraviolet rays to disperse the electrons in the insulation film 4 as well as by applying a relatively high voltage to the area between the gate and the drain to inject hot holes produced in the end of the drain region 3 into the insulation film 4 so as to neutralize the electrons in the insulation film 4.

In the above-mentioned prior art, however, the electrons are locally stored in the insulation film 4 in the vicinity of the drain region 3. Accordingly, it is difficult in a writing state to raise the threshold voltage Vth (=V1). It therefore is difficult to make large the amount of the change of the threshold voltage Vth (hereinafter referred to as a "memory window") $\Delta V_{FB}(=V1-V2)$. This will be described in detail with reference to FIG. 9(b).

More specifically, in the above-mentioned prior art, the positive read voltage is applied to the drain region 3 at the time of reading. When the voltage applied to the drain region 3 is high, a depletion layer 7 extends from the end of the drain region 3 so that the channel region 8 disappears. Alternatively, a space-charge layer appears. Since charges injected into this space-charge layer are accelerated with little resistance, they are moved between the source and the drain without being significantly affected by the charges trapped in the insulation film 4. Consequently, even if electrons are trapped in the insulation film 4, the threshold voltage Vth cannot be made sufficiently high.

When the positive sense voltage is applied to the gate 5 in a state where electrons are injected into the insulation layer 4 so that the threshold voltage Vth takes a high value V1, therefore, conduction may occur between the source and the drain due to a current flowing through the above-mentioned space-charge layer. That is, a slight shift of the sense voltage to be applied to the gate 5 at the time of reading results in erroneous reading because the memory window $\Delta V_{FB}$ is small. The operation of the memory cell is liable to be unstable because of the difficulty in making the memory window $\Delta V_{FB}$ large.

On the other hand, an attempt to inject large amounts of hot electrons into the insulation film 4, so as to make the memory window $\Delta V_{FB}$ large, causes the necessity of applying a relatively high voltage to the drain region 3 at the time of writing, resulting in a decreased number of times the memory cell may be written into.

On the other hand, the impurity concentration of the drain region 3 is abruptly changed in the boundary between the drain region 3 and the channel region 8 so as to enhance the production efficiency of hot electrons, as described above. However, the memory cell has a structure in which hot electrons are thus easily produced. Accordingly, trace amounts of hot electrons are produced even by a low voltage applied to the drain region 3 at the time of reading. Consequently, every time information is read out from the cell, trace amounts of hot electrons produced in the end 3A of the drain region 3 are injected into the insulation film 4. Therefore, the threshold voltage Vth of the transistor is slightly changed. Such a phenomenon is generally referred to as soft writing.

The higher the read voltage applied to the drain region 3 at the time of reading is, the more easily soft writing occurs. Accordingly, if an attempt to realize constant resistance to soft writing is made, the read voltage is restricted to a low voltage. Consequently, there is a limit on a read current of the cell, so that the reading speed is prevented from being increased.

SUMMARY OF THE INVENTION

Therefore, an object of the present invention is to provide a semiconductor memory device capable of stably performing an operation as well as capable of effectively preventing soft writing.

The semiconductor memory device according to the present invention is so adapted that at the time of reading out information, the polarity of a voltage applied across the area between a source region and a drain region is made opposite to that at the time of writing information, and a predetermined sense voltage is applied to a gate to watch whether or not a transistor is rendered conductive.

In this construction of the semiconductor memory device, when information is read out, a voltage which is opposite in polarity to that at the time of writing information is applied across the area between the source and the drain. Accordingly, when the sense voltage is applied to the gate, a channel extending from the drain region to the source region is formed. In a state where charges are locally trapped in a region, in the vicinity of the drain region, of the insulation film, therefore, the formation of the channel is delayed in the vicinity of the drain region. That is, according to the construction of the semiconductor memory device in the prior art, in which the voltages applied across the area between the source and the drain are equal in polarity at the time of reading and at the time of writing, the channel is formed from the source region toward the drain region, so that the formation of the channel is not delayed even in a state where charges are trapped in the region, in the vicinity of the drain region, of the insulation film. On the other hand, in the present invention, the formation of the channel can be delayed, as described above.

Consequently, it is possible to make large a memory window which is the difference between a threshold voltage for allowing conduction between the source and the drain in a writing state where charges are trapped in the insulation film and a threshold voltage in an erasing state where no charges are trapped. Even if the sense voltage applied to the gate at the time of reading is slightly shifted, it is possible to accurately read out information stored in the memory cell, thereby to stabilize the operation of the cell.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5(a) is a plan view, FIG.(b) is a cross sectional view as viewed from a cutting line Vb—Vb shown in FIG. 5(a), and FIG. 5(c) is a cross sectional view as viewed from a cutting line Vc—Vc shown in FIG. 5(a);

FIG. 6(a) is a plan view, FIG. 6(b) is a cross-sectional view as viewed from a cutting line VIb—VIb shown in FIG. 6(a), and FIG. 6(c) is a cross-sectional view as viewed from a cutting line VIc—VIc shown in FIG. 6(a);

FIG. 7(a) is a plan view, FIG. 7(b) is a cross-sectional view as viewed from a cutting line VIIb—VIIb shown in FIG. 7(a), and FIG. 7(c) is a cross sectional view as viewed from a cutting line VIIc—VIIc shown in FIG. 7(a);

FIG. 8(a) is a plan view, FIG. 8(b) is a cross sectional view as viewed from a cutting line VIIIb—VIIIb shown in FIG. 8(a), and FIG. 8(c) is a cross sectional view as viewed from a cutting line VIIIc—VIIIc shown in FIG. 8(a)

DESCRIPTION OF THE PREFERRED EMBODIMENTS

Figure 1:
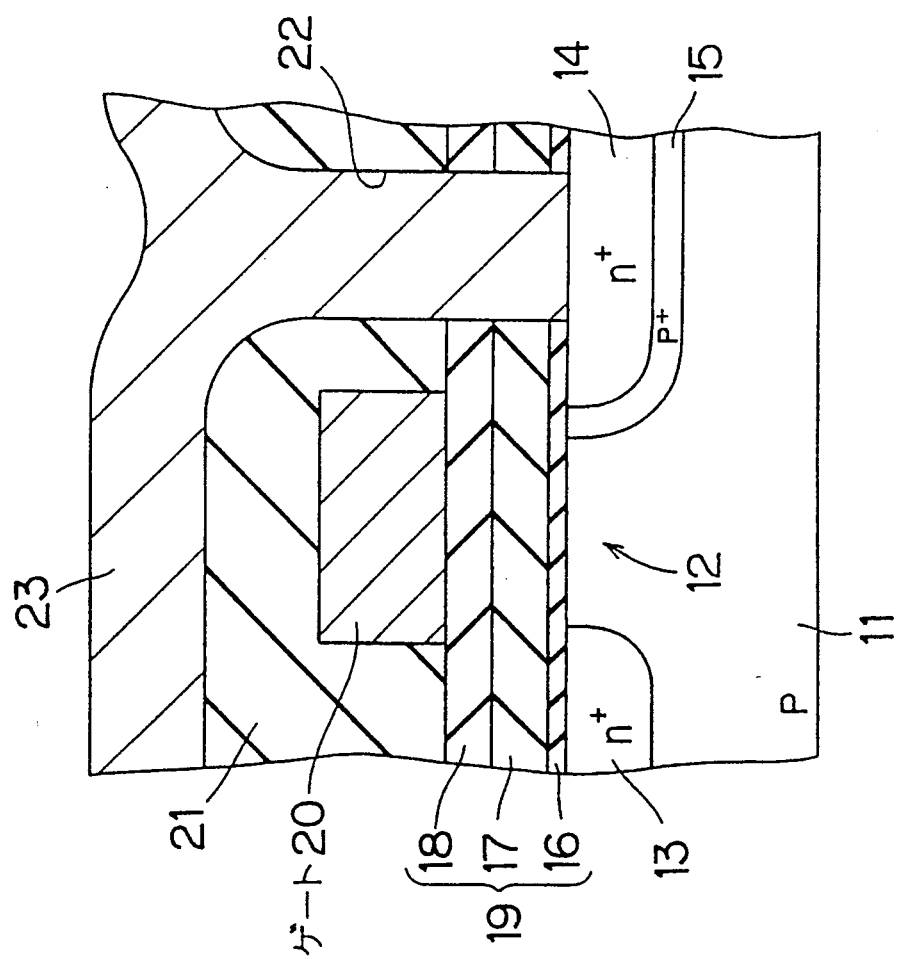
FIG. 1 is a cross-sectional view showing the construction of a transistor constituting a memory cell which is applied to a semiconductor memory device according to an embodiment of the present invention.

FIG. 1 is a cross sectional view showing the construction of a transistor constituting a memory cell of a semiconductor memory device according to one embodiment of the present invention. An $n^+$-type source region 13 and an $n^+$-type drain region 14 are formed with a channel region 12 being interposed therebetween on a p-type semiconductor substrate 11. A $p^+$-type diffusion layer 15 is formed in the boundary between the drain region 14 and the semiconductor substrate 11 so as to increase the efficiency of production of hot electrons by forming a strong electric field in this boundary. In addition, the impurity concentration in the boundary between the source region 13 and the semiconductor substrate 11 changes gradually. This boundary has a structure withstanding high pressure.

An insulation film 19 having an ONO (Oxide-Nitride-Oxide) structure comprising a tunnel oxide film 16, a nitride film 17 and a top oxide film 18 is formed on the surface of the channel region 12, and a gate 20 is further formed on the insulation film 19. An aluminum interconnection 23 connected to the drain region 14 through a contact hole 22 is formed on the insulation film 19 and the gate 20 with an interlayer insulation film 21 being interposed therebetween.

Figure 2:
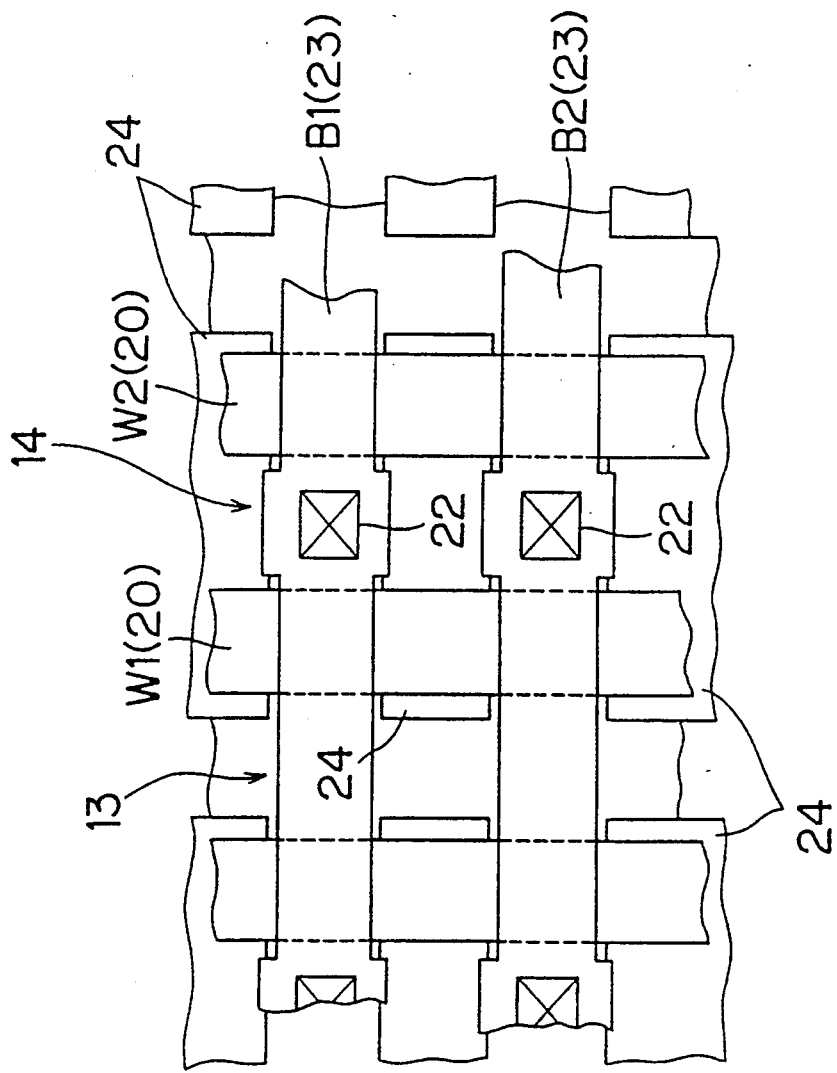
FIG. 2 is a plan view showing an arrangement of a part of the memory cell according to the above-mentioned embodiment.

FIG. 2 is a plan view showing the arrangement of memory cells of the semiconductor memory device in which the above-mentioned transistor is used as a memory cell, which shows the construction excluding the interlayer insulation film 21. In FIG. 2, the same reference numerals are assigned to portions corresponding to the above-mentioned portions shown in FIG. 1.

The gate 20 is shared by a plurality of transistors aligned in a constant direction to form word lines W1, W2, ···, and the aluminum interconnection 23 is connected together to respective drain regions 14 of transistors aligned in a direction intersecting the word lines W1, W2, ··· to form bit lines B1, B2, ···. Reference numeral 24 denotes a field oxide film.

Figure 3:
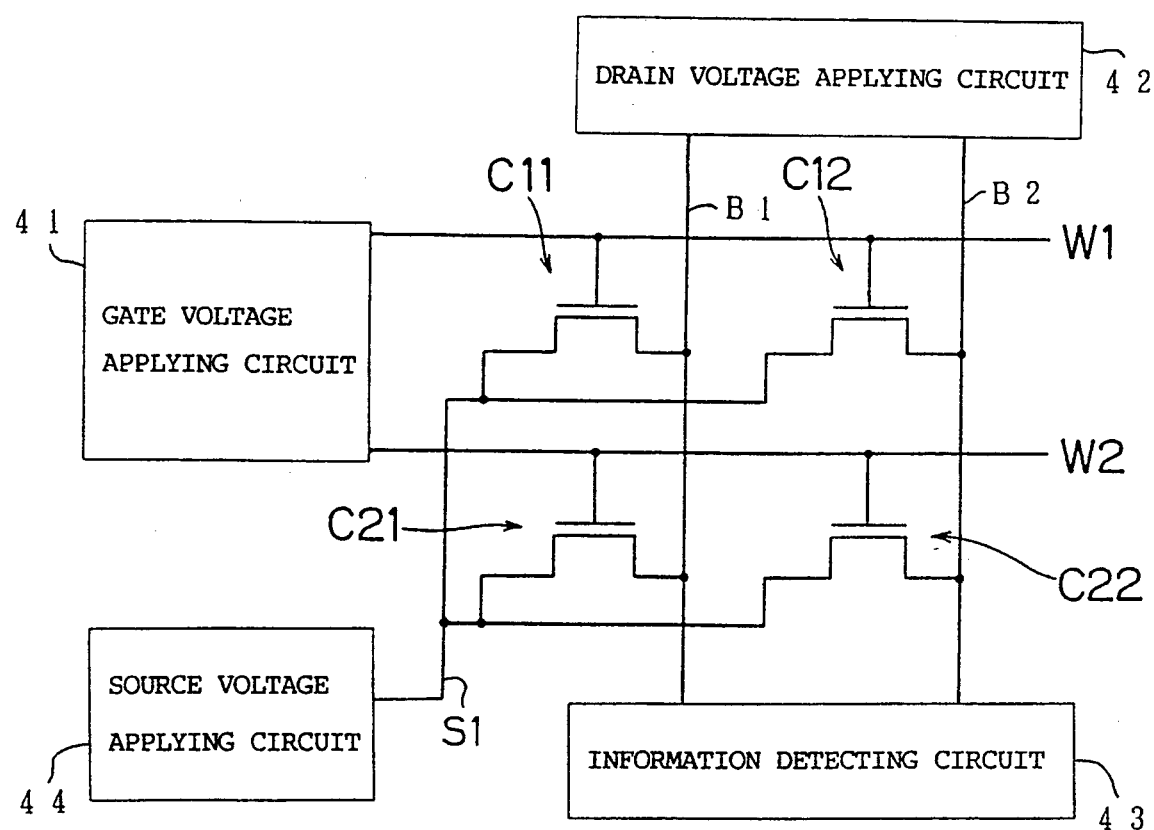
FIG. 3 is a circuit diagram showing the electrical construction of a part of the semiconductor memory device according to the above-mentioned embodiment.

FIG. 3 is an electric circuit diagram illustrating the semiconductor memory device shown in FIG. 2, which shows the circuit arrangement of adjacent four memory cells C11, C12, C21 and C22. A word line W1 connected to gates of the memory cells C11 and C12 and a word line W2 connected to gates of the memory cells C21 and C22 are connected to a gate voltage applying circuit 41. The gate voltage applying circuit 41 selectively applies a write control voltage or a read control voltage (sense voltage) as described later to the word line W1 or W2. In addition, a bit line B1 is connected to drains of transistors constituting the memory cells C11 and C21, and a bit line B2 is connected to drains of transistors constituting the memory cells C12 and C22. The bit lines B1 and B2 are connected to a drain voltage applying circuit 42 and an information detecting circuit 43. The drain voltage applying circuit 42 is a circuit for selectively applying a write voltage to the bit line B1 or the bit line B2 at the time of writing information as described later. On the other hand, the information detecting circuit 43 is used for detecting a potential appearing on the bit line B1 or the bit line B2 to determine whether information stored in the memory cell is 0 or 1 at the time of reading out information, as described later.

Furthermore, sources of the transistors constituting the respective memory cells C11, C12, C21 and C22 are connected together to a line S1. The line S1 is connected to a source voltage applying circuit 44. The source voltage applying circuit 44 is used for applying predetermined voltages to the sources of the respective transistors through the line S1 at the time of reading out information stored in the memory cell or erasing information stored in the memory cell, as described later.

The following Table 1 collectively shows voltages applied to the word lines W1 and W2, the bit lines B1 and B2, and the line S1 as well as the semiconductor substrate 11 in respective cases where information is written, read out and erased with respect to the memory cell C11. In addition, FIGS. 4(a) and FIG. 4(b) respectively illustrate the states of the memory cell at the time of writing information and at the time of reading out information.

Figure 4:
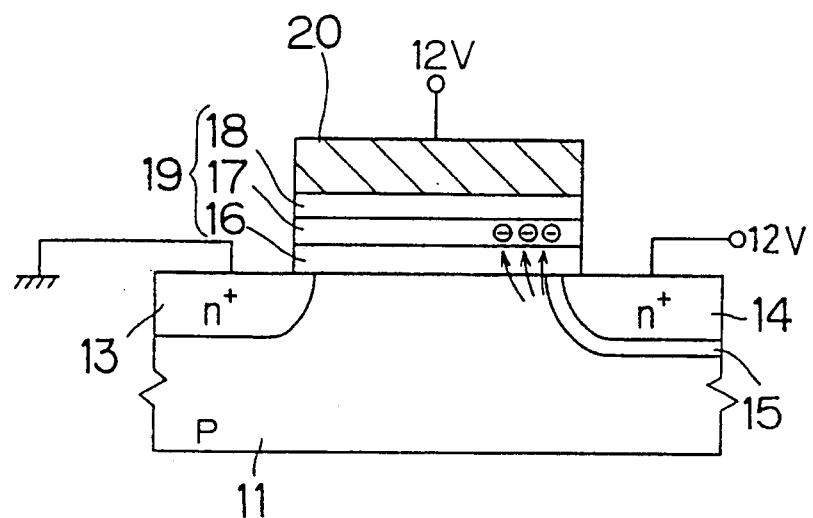
FIGS. 4(a) and 4(b) are simplified cross sectional views for explaining the operation of the memory cell according to one embodiment of the present invention.
Figure 4:
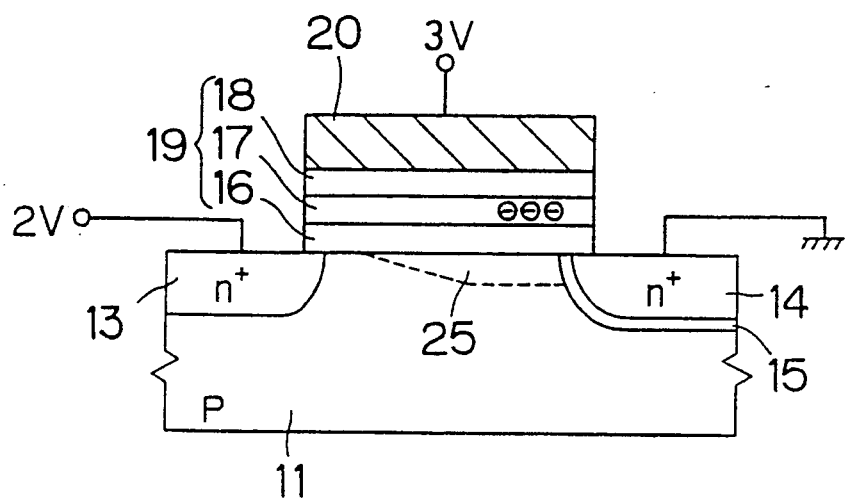

Description is now made of the respective operations of writing, reading out and erasing information with respect to the memory cell C11 on the basis of the Table 1 and with reference to FIGS. 3, 4(a) and 4(b).

[TABLE 1]

| (unit: volt) operation | W1 | W2 | B1 | B2 | S1 | Substrate |
|---|---|---|---|---|---|---|
| write | 12 | 0 | 12 | 0 | 0 | 0 |
| read | 3 | 0 | 0 | 2 | 2 | 0 |
| erase | erasing of ultraviolet rays | | | | | |

[Writing Operation]

In writing information to the memory cell C11, high voltages of 12 volts are respectively applied to the bit line B1 and the word line W1 by the drain voltage applying circuit 42 and the gate voltage applying circuit 41, and the line S1 is brought into a ground potential by the source voltage applying circuit 44. Consequently, the transistor constituting the memory cell C11 enters a state shown in FIG. 4(a), where hot electrons are produced due to a strong electric field produced in the boundary between the drain region 14 and the channel region 12. The hot electrons are locally injected into the nitride film 17 through the tunnel oxide film 16 in the vicinity of the drain region 14. Both the word line W2 and the bit line B2 are brought into a ground potential by the gate voltage applying circuit 41 and the drain voltage applying circuit 42, so that the memory cells C12, C21 and C22 enter a non-selected state.

A gate voltage required to allow conduction between the source and the drain varies depending on a state where electrons are stored in the insulation film 19 and a state where no electrons are stored therein. That is, a threshold voltage Vth for allowing conduction between the source and the drain takes a high value V1 (for example, 5 volts) in the state where electrons are injected into the insulation film 19, while taking a low value V2 (for example, 1 volt, where V2<V1) in the state where no electrons are injected. Binary data "1" or "0" can be stored in each of the memory cells by thus setting the threshold voltage Vth to two types of threshold voltages.

[Reading Operation]

In reading out information from the memory cell C11, a sense voltage of, for example, 3 volts is applied to the word line W1 by the gate voltage applying circuit 41. At this time, no voltage is applied to the word line W2. In addition, only the bit line B1 is brought into a zero potential by the drain voltage applying circuit 42. Furthermore, the same voltage (for example, 2 volts) as that applied to the line S1 is applied to the bit line B2, or the bit line B2 is opened. In addition, a positive voltage of 2 volts is applied to the line S1 by the source voltage applying circuit 44. The transistor constituting the memory cell C11 at this time enters a state shown in FIG. 4(b). That is, a voltage applied across the area between the source and the drain of the memory cell C11 is an inverted voltage relative to that at the time of writing, and no voltage is applied to the drain.

The sense voltage is a voltage taking a value intermediate between the above-mentioned two types of values V1 and V2 of the threshold voltage Vth. Consequently, if the sense voltage is applied, conduction/non-conduction between the source and the drain is determined depending on whether or not electrons are stored in the insulation film 19.

The above-mentioned operation of the transistor constituting the memory cell at the time of reading out information will be described in more detail with reference to FIG. 4(b). A positive voltage of 2 volts is applied to the line S1, so that this voltage is applied to the source region 13. In addition, the bit line B1 is brought into a zero potential, so that the drain region 14 is brought into a zero potential. Furthermore, the sense voltage applied to the word line W1 is applied from the gate 20. In this state, a channel 25 is formed from the vicinity of the drain region 14 toward the source region 13. In a writing state where electrons are trapped in the insulation film 19, however, the channel 25 is not so formed as to make connection between the source and the drain even when the sense voltage is applied to the gate 20, so that the area between the source and the drain is kept in a non-conductive state.

Figure 9A:
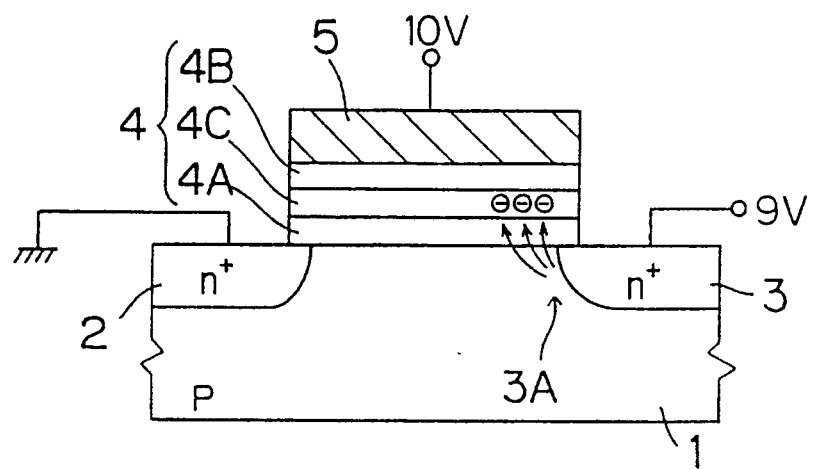
FIGS. 9(a) and 9(b) are cross-sectional view for explaining the operation of a transistor constituting a memory cell which is conventionally applied to a semiconductor memory device.
Figure 9B:
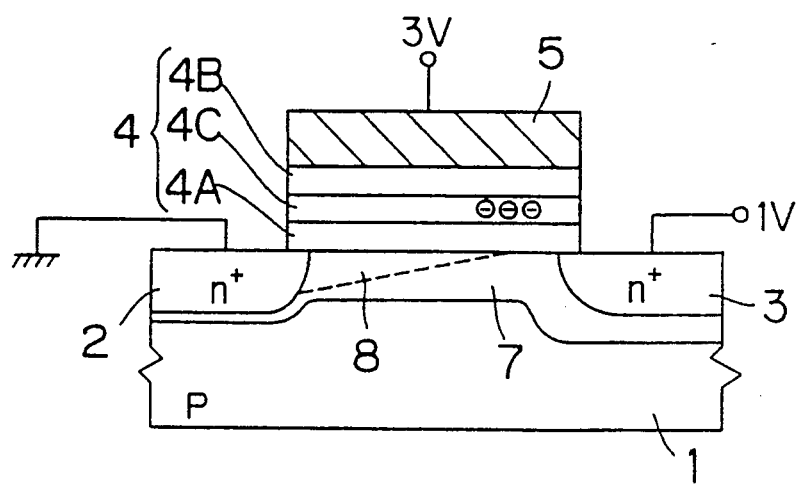

Meanwhile, in a state where electrons are locally injected into the insulation film 19 in the vicinity of the drain region 14, the formation of a surface inverting layer serving as a channel is delayed in the vicinity of the drain region 14. More specifically, referring to FIGS. 9(a) and 9(b), in the construction of the semiconductor memory device in the prior art in which the positive read voltage is applied to the drain region 3, even in a state where electrons are trapped in the insulation film 4, the electrons are unevenly distributed on the side of the drain region 3, so that the channel is quickly formed in the vicinity of the source region 2.

On the other hand, in the construction of the semiconductor memory device in the present embodiment, a constant delay occurs in the formation of the channel in the vicinity of the drain region 14, serving as the source at the time of reading. In the present embodiment, therefore, the threshold voltage Vth in a writing state is made higher than that in the prior art shown in FIGS. 9(a) and 9(b). In other words, even when the same amount of charge is trapped in the insulation film 19 at the time of writing, the memory window $\Delta V_{FB}$ (=V1−V2) can be made larger than that in the prior art.

The memory window $\Delta V_{FB}$ can be thus made large. Accordingly, even if the sense voltage applied to the gate 20 is slightly shifted, information stored in the cell can be accurately read out, to stabilize the operation of the cell.

Additionally, if no voltage is applied to the drain region 14, hot electrons are prevented from being produced in the boundary between the drain region 14 and the substrate 11, so that the change in the amount of charge stored in the insulation film 19 is restrained. Consequently, in the above-mentioned reading operation accompanied by the application of a voltage, it is possible to effectively prevent so-called soft writing.

Turning to FIG. 3, description is further made of the operation at the time of reading. When no electrons are stored in the insulation film 19, the threshold voltage Vth takes a value V2 lower than the sense voltage, so that conduction occurs between the source and the drain of the memory cell C11. Consequently, the potential on the bit line B1 which is first zero is increased to 2 volts by the application of the sense voltage. On the other hand, when electrons are stored in the insulation film 19, the threshold voltage Vth is higher than the sense voltage, so that the memory cell C11 is kept in a non-conductive state. Accordingly, the potential on the bit line B1 remains zero. Consequently, the above-mentioned respective voltages are applied to the word lines W1 and W2, the bit lines B1 and B2 and the line S1 by the respective voltage applying circuits 41, 42 and 44, and the change of the potential on the bit line B1 is examined by the information detecting circuit 43, thereby to make it possible to read out information stored in the memory cell C11.

Moreover, in a case where the information detecting circuit is connected to the source of the memory cell C11, when the memory cell C11 is kept in a conductive state, the voltage of zero applied to the bit line B1 is applied to the source line S1, so that a potential on the source line S1 is decreased from 2 volts to zero. On the other hand, when the memory cell C11 is kept in a non-conductive state, a potential on the source line is kept at 2 volts. Consequently, it is possible to read out information stored in the memory cell C11 from the source.

Meanwhile, which of the application of the voltage of 2 volts to the line S1 by the source voltage applying circuit 44 and the application of the sense voltage to the word line W1 by the gate voltage applying circuit 41 may be first achieved. The change of the potential on the bit line B1 before and after the application of the voltage applied later is watched, thereby to make it possible to read out stored information.

The source region 13 has a structure withstanding high pressure where hot electrons are not easily produced by making gradual the change in the impurity concentration between the source region 13 and the semiconductor substrate 11. Even if a somewhat higher voltage is applied to the source region 13 at the time of reading out information, therefore, no soft writing occurs. Consequently, a current from the bit line B1 can be increased by setting the read voltage applied to the source region 13 to a relatively high voltage, thereby to make it possible to improve the reading speed and accurately read out information.

When the voltages are applied as shown in Table 1, the same voltage as that applied to the line S1 is applied to the bit line B2 (or the bit line B2 is brought into an opened state), so that the memory cells C12 and C22 are kept in a non-conductive state without depending on the voltages applied to the word lines W1 and W2. In addition, since no sense voltage (3 volts) is applied to the word line W2, the memory cell C21 is kept in a non-conductive state without depending on the state of the bit line B1.

[Erasing Operation]

The erasing operation is performed with respect to all the memory cells C11, C12, C21 and C22. That is, charges stored in the insulation film 18 in the transistor constituting each of the memory cells are dispersed by the irradiation of ultraviolet rays. Consequently, information stored in all the memory cells are erased.

The stored information are also erased by applying positive high voltages (for example, 9 volts) to the bit lines B1 and B2 as well as applying negative voltages (for example, −6 volts) to the word lines W1 and W2. In this case, in the transistor constituting the memory cell, hot holes are produced in the boundary between the drain region 14 and the channel region, and the hot holes are injected into the insulation film 19, so that charge in the insulation film 19 is neutralized, to erase the stored information.

As described in the foregoing, according to the present invention, in reading out stored information, the voltage between the source and the drain of the transistor constituting the memory cell is made opposite in polarity to that at the time of writing stored information. That is, a positive high voltage (for example, 12 volts) is applied to the drain region 14 at the time of writing, while a positive voltage is applied to the source region 13 at the time of reading. Consequently, when a sense voltage is applied to the gate 20, the channel 25 extending from the drain region 14 toward the source region 13 is formed. In this case, in a writing state where electrons are locally trapped in the insulation film 19, the formation of the channel in the vicinity of the drain region 14 is delayed. Accordingly, the threshold voltage Vth in a writing state can be made higher, as compared with that in the prior art in which the formation of the channel is not delayed. As a result, the memory window $\Delta V_{FB}$ can be made large. Accordingly, even when the sense voltage is slightly shifted, information is not erroneously read out, thereby to make it possible to ensure a stable operation.

On the other hand, even if the amount of charge injected into the insulation film 19 is not made too large, it is possible to ensure a sufficient memory window $\Delta V_{FB}$, so that the voltage applied to the drain region 14 at the time of writing need not be excessively increased. As a result, the stress applied to the drain region 14 can be decreased, thereby to make it possible to increase the number of times of the memory cell may be written into.

On the other hand, as a result of applying a positive voltage to the source region 13 at the time of reading and bringing the drain region 14 into a ground potential, no hot electrons are produced in the boundary between the drain region 14 and the channel region. Consequently, so-called soft writing can be effectively prevented, thereby to make it possible to satisfactorily hold stored information.

Figure 5A:
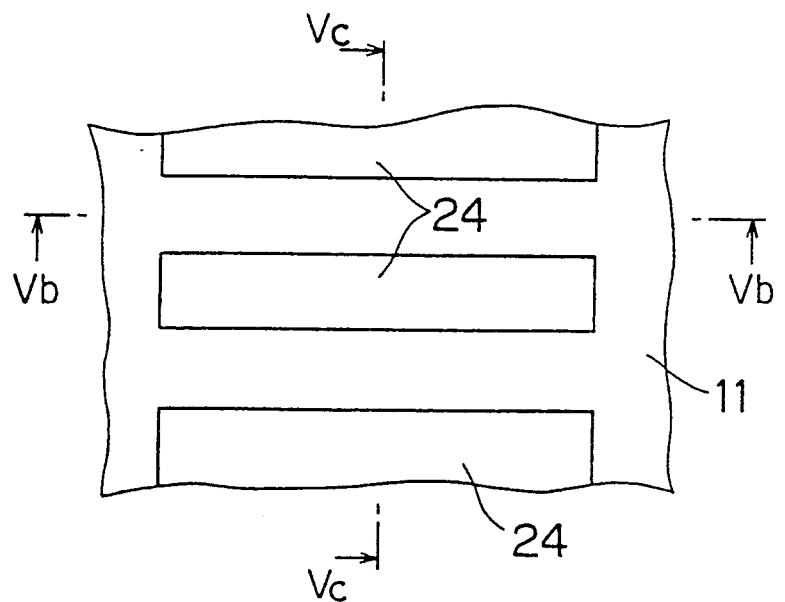
FIGS. 5(a), 5(b), 5(c) are diagrams for explaining a method of manufacturing the memory cell according to the above-mentioned embodiment, where
Figure 5B:
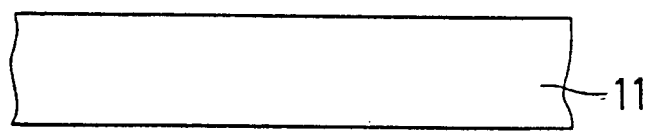
Figure 5C:
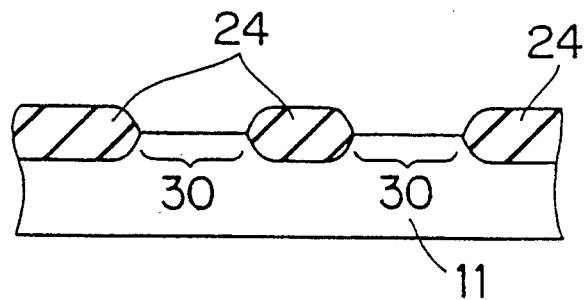
Figure 6:
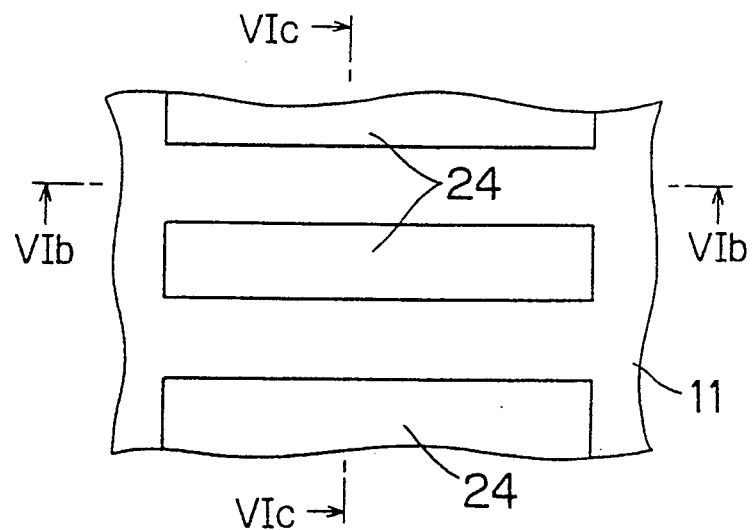
FIGS. 6(a), 6(b), 6(c) are diagrams for explaining a method of manufacturing the memory cell according to the above-mentioned embodiment, where
Figure 6:
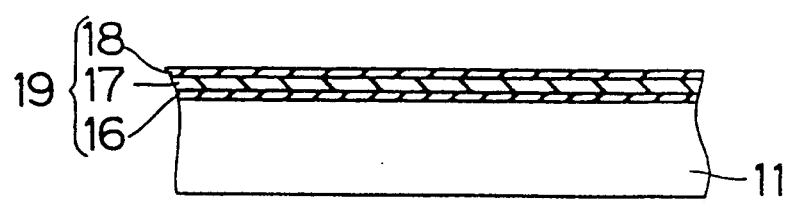
Figure 6:
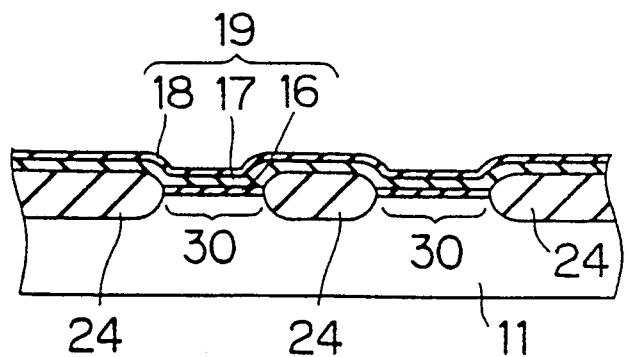

Description is now made of a method of manufacturing a memory cell of the above-mentioned semiconductor memory device with reference to FIGS. 5(a) to 8(c). As shown in FIGS. 5(a) and 5(c), a field oxide film 24 is first formed on a semiconductor substrate 11 by the LOCOS (Local Oxidation of Silicon) process, to separate an active region 30. FIG. 5(a) is a plan view, FIG. 5(b) is a cross-sectional view as viewed from a cutting line Vb—Vb shown in FIG. 5(a), and FIG. 5(c) is a cross-sectional view as viewed from a cutting line Vc—Vc shown in FIG. 5(a). In each of FIGS. 6(a) to 8(c), the correspondence among (a) to (c) is the same as the above-mentioned correspondence shown in FIGS. 5(a) to 5(c).

As shown in FIGS. 6(a), 6(b) and 6(c), a tunnel oxide film 16 is then formed on the surface of the semiconductor substrate 11 in a portion of the active region 30. Furthermore, a nitride film 17 and a top oxide film 18 are stacked in this order on the entire surface of the tunnel oxide film 16. In FIG. 6(a), the illustration of the tunnel oxide film 16, the nitride film 17 and the top oxide film 18 is omitted.

Figure 7A:
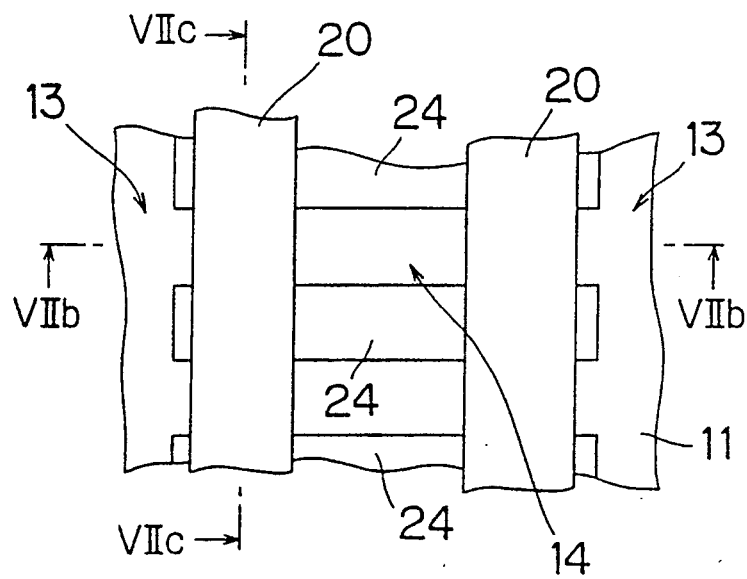
FIGS. 7(a), 7(b), 7(c) are diagrams for explaining a method of manufacturing the memory cell according to the above-mentioned embodiment, where
Figure 7B:
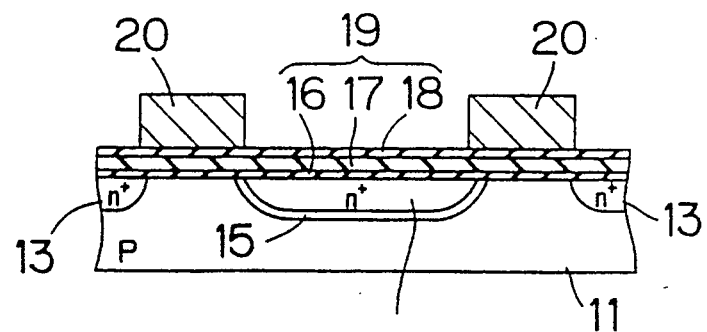
Figure 7C:
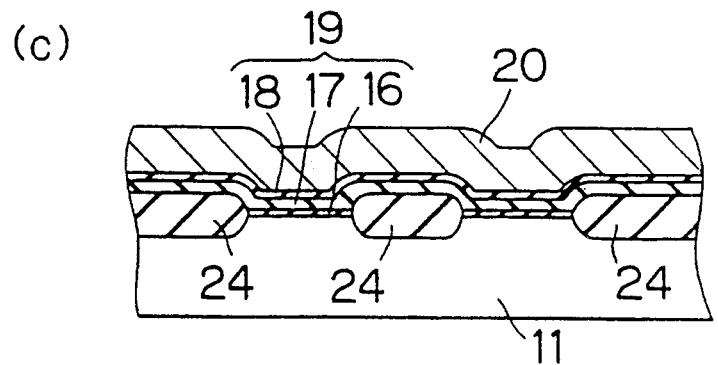

As shown in FIGS. 7(a), 7(b) and 7(c), a gate 20 composed of a polysilicon film whose resistance is decreased by doping of phosphorus is subsequently patterned using the photolithographic technique.

In this state, boron ions are implanted and arsenic ions are implanted, to form a drain region 14 and a p-type diffusion layer 15. In addition, arsenic ions are implanted to form an n+-type source region 13 having a structure withstanding high pressure by making gradual the change in the impurity concentration in the boundary.

Figure 8A:
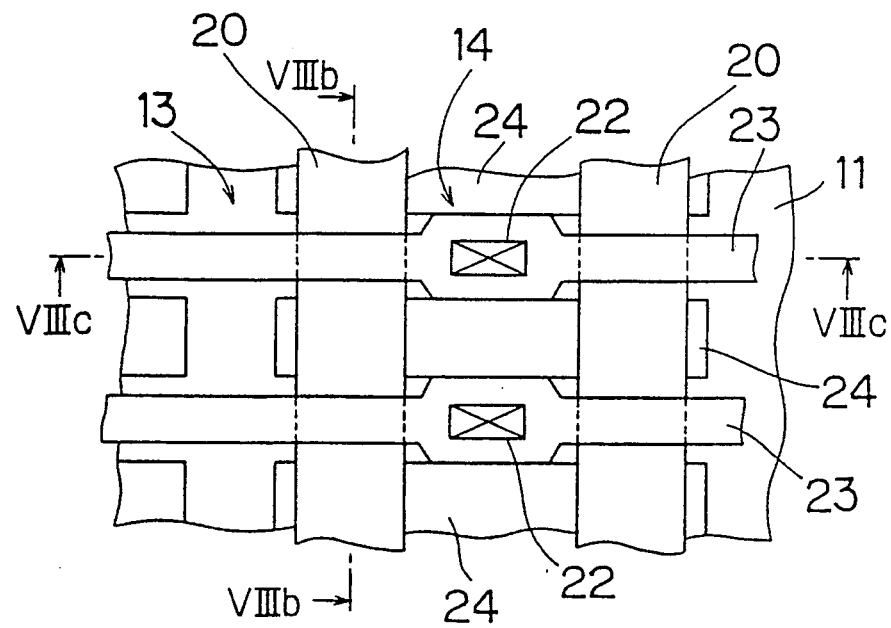
FIGS. 8(a), 8(b), 8(c) are diagrams for explaining a method of manufacturing the memory cell according to the above-mentioned embodiment, where
Figure 8B:
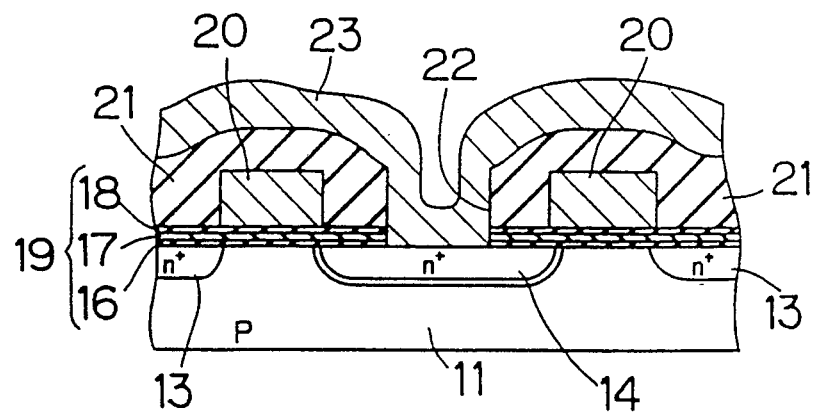
Figure 8C:
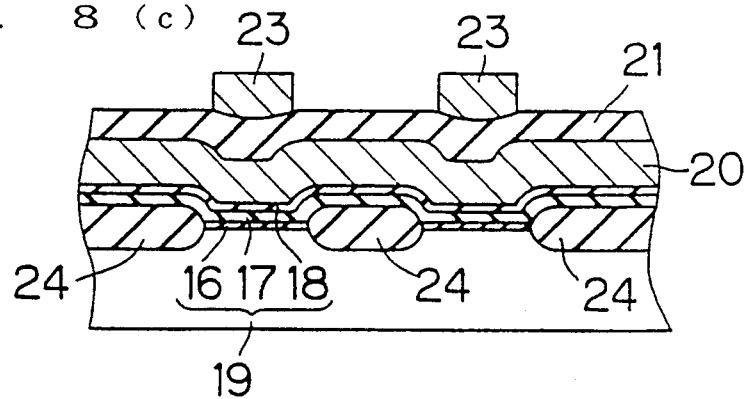

As shown in FIGS. 8(a), 8(b) and 8(c), an interlayer insulation film 21 is subsequently formed. In this interlayer insulation film 21, a contact hole 22 is formed above the drain region 14. An aluminum interconnection 23 connected to the drain region 14 through the contact hole 22 is formed. In such a manner, the transistor constituting the memory cell having the structure shown in FIG. 1 is obtained. In FIG. 8(a), the illustration of the tunnel oxide film 16, the nitride film 17 and the top oxide film 18 as well as the interlayer insulation film 21 is omitted.

Meanwhile, the present invention is not limited to the above-mentioned embodiment. For example, although in the above-mentioned embodiment, description was made of a case where hot electrons are produced in the boundary between the drain region 13 and the channel region 12 and the hot electrons are injected into the insulation film 19 to write information, the present invention is easily applicable to a case where hot holes are produced in the boundary between the drain region 13 and the channel region 12 and the hot holes are locally injected into the insulation film 19 to write information. That is, also in this case, a voltage having a polarity applied to the drain region at the time of writing is applied to the source region at the time of reading, thereby to make it possible to ensure a large memory window to stabilize the operation of the memory cell as well as to satisfactorily read out stored information while effectively preventing soft writing. Furthermore, various modifications can be made in the range in which the gist of the present invention is not changed.

As described in the foregoing, according to the present invention, the memory window can be made large. Accordingly, even when the sense voltage applied to the gate at the time of reading is slightly shifted, it is possible to accurately read out the information stored in the memory cell. In such a manner, it is possible to stabilize the operation of the cell.

On the other hand, even if the amount of charge injected into the insulation film is relatively small, a desired memory window can be obtained. Accordingly, it is possible to decrease a voltage applied to the drain region or the like at the time of writing. As a result, the stress applied to the drain region can be decreased, thereby to make it possible to increase the number of times the memory may be written into.

Additionally, the hot electrons or hot holes can be prevented from being produced in the boundary between the drain region and the channel region at the time of reading out information. Accordingly, the amount of charges stored in the insulation film can be prevented from being changed at the time of reading out information, thereby to make it possible to reliably prevent so-called soft writing.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a memory cell comprising a transistor having a source region and a drain region formed on a semiconductor substrate, a channel region so formed as to be interposed between said source region and said drain region, an insulation film formed above the channel region, and a gate formed on the insulation film;

writing operation control means for applying a first voltage across the area between said drain region and said source region so that a potential in the drain region is relatively higher than a potential in the source region and applying a predetermined write control voltage to said gate so as to write information to said memory cell, thereby to allow conduction between said drain region and said source region as well as produce hot electrons or hot holes in the boundary between said drain region and said channel region and locally trap the hot electrons or hot holes produced in said insulation film in the vicinity of the drain region;

reading operation control means for applying a second voltage across the area between said drain region and said source region so that the potential in the source region is relatively higher than the potential in the drain region and applying a predetermined sense voltage to said gate so as to read out the information written in said memory cell, wherein the second voltage is opposite in polarity to and lower in magnitude than the first voltage; and information detecting means for detecting the information written in said memory cell by detecting a potential appearing in said drain region or in said source region in a case where the second voltage and the sense voltage are applied by said reading operation control means.

2. The semiconductor memory device according to claim 1, wherein said insulation film comprises a trapping film provided in the center of said insulation film for trapping said hot electrons or hot holes, a tunnel film adjacent to the lower surface of said trapping film, and a gate connecting film adjacent to the upper surface of said trapping film.

3. The semiconductor memory device according to claim 2, wherein said insulation film has an Oxide-Nitride-Oxide structure comprising a tunnel oxide film, a nitride film and a top oxide film formed in ascending order.

4. The semiconductor memory device according to claim 1, wherein said writing operation control means brings the source region into a zero potential and respectively applies predetermined positive voltages to the drain region and the gate at the time of writing information to said memory cell.

5. The semiconductor memory device according to claim 1, wherein said reading operation control means brings the drain region into a zero potential and applies a predetermined positive read voltage lower in magnitude than the first voltage to the source region at the time of reading out information.

6. The semiconductor memory device according to claim 4, wherein said reading operation control means brings the drain region into a zero potential and applies a predetermined positive read voltage lower in magnitude than the first voltage to the source region at the time of reading out information.

7. The semiconductor memory device according to claim 5, wherein the predetermined sense voltage applied to said gate by said reading operation control means is set to a voltage lower in magnitude than the write control voltage and at which no conduction occurs between said source region and said drain region when electrons are locally trapped in said insulation film, while conduction occurs between said source region and said drain region when no electrons are locally trapped in said insulation film.

8. The semiconductor memory device according to claim 6, wherein the predetermined sense voltage applied to said gate by said reading operation control means is set to a voltage lower in magnitude than the write control voltage and at which no conduction occurs between said source region and said drain region when electrons are locally trapped in said insulation film, while conduction occurs between said source region and said drain region when no electrons are locally trapped in said insulation film.

9. The semiconductor memory device according to claim 8, wherein the boundary between said drain region and said semiconductor substrate has a structure in which hot electrons are easily produced.

10. The semiconductor memory device according to claim 9, wherein said drain region comprises an n+-type impurity region having a high concentration formed on a p-type semiconductor substrate, and a p+-type diffusion layer is formed in the boundary between said drain region and said semiconductor substrate so that hot electrons are easily produced.

11. The semiconductor memory device according to claim 3, wherein said writing operation control means brings the source region into a zero potential and respectively applies predetermined positive voltages to the drain region and the gate at the time of writing information to said memory cell.

12. The semiconductor memory device according to claim 3, wherein said reading operation control means brings the drain region into a zero potential and applies a predetermined positive read voltage lower in magnitude than the first voltage, to the source region at the time of reading out information.

13. The semiconductor memory device according to claim 11, wherein said reading operation control means brings the drain region into a zero potential and applies a predetermined positive read voltage lower in magnitude than the first voltage, to the source region at the time of reading out information.

14. The semiconductor memory device according to claim 12, wherein the predetermined sense voltage applied to said gate by said reading operation control means is set to a voltage lower in magnitude than the write control voltage and at which no conduction occurs between said source region and said drain region when electrons are locally trapped in said insulation film, while conduction occurs between said source region and said drain region when no electrons are locally trapped in said insulation film.

15. The semiconductor memory device according to claim 13, wherein the predetermined sense voltage applied to said gate by said reading operation control means is set to a voltage lower in magnitude than the write control voltage and at which no conduction occurs between said source region and said drain region when electrons are locally trapped in said insulation film, while conduction occurs between said source region and said drain region when no electrons are locally trapped in said insulation film.

16. The semiconductor memory device according to claim 15, wherein the boundary between said drain region and said semiconductor substrate has a structure in which hot electrons are easily produced.

17. The semiconductor memory device according to claim 16, wherein said drain region comprises an n+-type impurity region having a high concentration formed on a p-type semiconductor substrate, and a p+-type diffusion layer is formed in the boundary between said drain region and said semiconductor substrate so that hot electrons are easily produced.

18. The semiconductor memory device according to claim 3, wherein
the boundary between said drain region and said semiconductor substrate has a structure in which hot electrons or hot holes are easily produced, and
the boundary between said source region and said semiconductor substrate has a structure withstanding high pressure.

19. A method of writing and reading out information for a semiconductor memory device using as a memory cell a transistor having a source region and a drain region formed on a semiconductor substrate, a channel region so formed as to be interposed between the source region and the drain region, an insulation film formed above the channel region, and a gate formed on the insulation film, comprising the steps of:
applying a first voltage across the area between the drain region and the source region so that a potential in the drain region is relatively higher than a potential in the source region, and applying a predetermined write control voltage to the gate in writing information to said memory cell, to locally inject hot electrons or hot holes produced in the boundary between said drain region and said channel region in said insulation film in the vicinity of the drain region and trap the hot electrons or hot holes produced therein; and
applying a second voltage, opposite in polarity to and lower in magnitude than the first voltage, across the area between said drain region and said source region se that the potential in the source region is relatively higher than the potential in the drain region, and applying a predetermined sense voltage to said gate in reading out the information written in said memory cell.

20. The method according to claim 19, wherein
said sense voltage is set to a voltage lower than the write control voltage and at which conduction occurs between said source region and said drain region when hot electrons or hot holes are locally stored in said insulation film, while no conduction occurs between said source region and said drain region when no hot electrons or hot holes are locally trapped in said insulation film.

21. The method according to claim 20, wherein
said insulation film has an Oxide-Nitride-Oxide structure comprising a tunnel oxide film, a nitride film and top oxide film formed in ascending order.

* * * * *